(12) United States Patent
Schneider et al.

(10) Patent No.: US 10,431,507 B2
(45) Date of Patent: Oct. 1, 2019

(54) CONTACT-VIA CHAIN AS CORROSION DETECTOR

(71) Applicant: Robert Bosch GmbH, Stuttgart (DE)

(72) Inventors: Daniel Schneider, Eningen Unter Achalm (DE); Franz Dietz, Willmandingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/573,252

(22) PCT Filed: May 9, 2016

(86) PCT No.: PCT/EP2016/060286
§ 371 (c)(1),
(2) Date: Nov. 10, 2017

(87) PCT Pub. No.: WO2016/180756
PCT Pub. Date: Nov. 17, 2016

(65) Prior Publication Data
US 2018/0138098 A1    May 17, 2018

(30) Foreign Application Priority Data

May 11, 2015 (DE) .......................... 10 2015 107 328

(51) Int. Cl.
*G01R 31/26* (2014.01)
*H01L 21/66* (2006.01)
(Continued)

(52) U.S. Cl.
CPC .......... *H01L 22/34* (2013.01); *G01R 31/2607* (2013.01); *G01R 31/2644* (2013.01);
(Continued)

(58) Field of Classification Search
CPC .... H01L 22/34; H01L 23/562; G01R 31/2607
See application file for complete search history.

(56) References Cited

U.S. PATENT DOCUMENTS 6,833,720 B1    12/2004  Daubenspeck
2003/0183851 A1*  10/2003  Ferianz ................. H01L 21/761
                                                                257/200

(Continued)

FOREIGN PATENT DOCUMENTS

DE    102011005363 A1    9/2011
DE    102012105848 A1    2/2013

OTHER PUBLICATIONS

International Search Report for PCT/EP2016/060286 dated Jul. 7, 2016.

*Primary Examiner* — Giovanni Astacio-Oquendo
*Assistant Examiner* — Alvaro E Fortich
(74) *Attorney, Agent, or Firm* — Norton Rose Fulbright US LLP; Gerard Messina

(57) ABSTRACT

A detector for determining a faulty semiconductor component including a semiconductor component, a contact-via chain, which is situated laterally at a distance from the semiconductor component and which surrounds the semiconductor component in regions, a guard ring, which is situated laterally at a distance from the semiconductor component, and an evaluation unit, which is situated on the semiconductor component, wherein the evaluation unit is designed to apply an electrical voltage to the contact-via chain, in particular a permanent electrical voltage, to detect a resistance value of the contact-via chain and to produce an output signal when the resistance value of the contact-via chain exceeds a threshold value.

4 Claims, 6 Drawing Sheets

(51) Int. Cl.
*H01L 23/58* (2006.01)
*H01L 23/522* (2006.01)
*H01L 23/528* (2006.01)
*H01L 23/00* (2006.01)

(52) U.S. Cl.
CPC ........ *H01L 23/528* (2013.01); *H01L 23/5226* (2013.01); *H01L 23/562* (2013.01); *H01L 23/585* (2013.01)

(56) References Cited

U.S. PATENT DOCUMENTS

| | | | |
|---|---|---|---|
| 2005/0127755 A1* | 6/2005 | Aichriedler | B60R 21/017 307/10.1 |
| 2007/0080422 A1* | 4/2007 | Falck | H01L 29/0661 257/491 |
| 2007/0096092 A1 | 5/2007 | Huang | |
| 2007/0262370 A1 | 11/2007 | Okada | |
| 2008/0036486 A1* | 2/2008 | Gattiker | G01R 31/2879 324/762.09 |
| 2009/0321734 A1 | 12/2009 | Ogawa | |
| 2010/0200431 A1 | 8/2010 | Kim | |
| 2013/0009663 A1 | 1/2013 | Gauch et al. | |
| 2014/0184262 A1* | 7/2014 | Poindexter | G01R 31/2853 324/759.03 |
| 2014/0237310 A1* | 8/2014 | Cheng | G01R 31/318541 714/727 |
| 2015/0276854 A1* | 10/2015 | Cejka | G01R 31/2818 324/762.02 |

* cited by examiner

CONTACT-VIA CHAIN AS CORROSION DETECTOR

BACKGROUND INFORMATION

The present invention relates to a detector for determining faulty semiconductor components and to a method for detecting faulty semiconductor components. In other words, the present invention relates to a contact-via chain as a corrosion and crack detector.

During their manufacture on a wafer, semiconductor components are separated by sawing trenches, which are used in the later assembly process for separation by sawing or other methods. The semiconductor elements are protected vis-à-vis these sawing trenches by a guard ring, the so-called scribe seal. The latter has the task both of stopping cracks caused by sawing the wafer as well as of preventing foreign molecules from diffusing into the circuit. The use of a guard ring is related art.

In addition, there are various approaches of controlling the function of the guard ring. U.S. Pat. No. 6,833,720 B1 describes a contact-via chain as a detection unit that tests specifically for damages by the ingress of water. U.S. Pat. No. 6,833,720 B1, on the other hand, is limited to components that use low-k materials as dielectric.

German Patent Application No. DE102012105848A1 and U.S. Patent App. Pub. No. 2013/0009663A1 describe a contact-via chain, which, however, in the specified system on measuring pads is able to be evaluated only initially in wafer tests.

U.S. Patent App. Pub. No. U.S. 2009/0321734 A1 describes an overall system whose sole function is to check a guard ring. The evaluation occurs by evaluating a capacitance signal.

SUMMARY

The detector for determining a faulty semiconductor component comprises a semiconductor component, a contact-via chain, which is situated laterally at a distance from the semiconductor component, a guard ring, which is likewise situated laterally at a distance from the semiconductor component and an evaluation unit, which is situated on the semiconductor component. According to the present invention, the evaluation unit is designed to apply an electrical voltage to the contact-via chain, to detect a resistance value of the contact-via chain and to produce an output signal when the resistance value of the contact-via chain exceeds a threshold value. The electrical voltage is in particular applied permanently to the contact-via chain.

The advantage in this respect is that a faulty component is detected early since the applied electrical voltage accelerates corrosion processes. Another advantage is that the evaluation occurs not by capacitance measurement, but rather by resistance measurement, which is markedly easier to integrate.

In a further development, the guard ring is situated outside of the contact-via chain.

Advantageous in this respect is the fact that it is possible to ascertain a risk of damage to the guard ring.

In another embodiment, the guard ring is situated between the semiconductor element and the contact-via chain.

The method according to the present invention for detecting faulty semiconductor elements comprises the application of an electrical voltage to a contact-via chain, the detection of a resistance value of the contact-via chain and the production of an output signal when the resistance value of the contact-via chain exceeds a threshold value. The electrical voltage is in particular applied permanently to the contact-via chain.

The advantage in this respect is that it is possible to check the guard ring initially and in operation. In other words, a faulty semiconductor element is determined early and it is possible for the evaluation to occur variably at different points in time, either during the final product test or in situ in operation. It is furthermore advantageous that it is possible to detect an increased risk for a failure of the guard ring. Additionally, by the change in the electrical resistance, it is possible to detect mechanical damages as well as corrosions by the ingress of water and other foreign substances. These corrosions are effectively accelerated by the permanent application of an electrical voltage. Because of this fact, the system also works for metals that are otherwise not very susceptible, but are frequently used, such as aluminum.

Further advantages derive from the following description of exemplary embodiments and from the dependent patent claims.

BRIEF DESCRIPTION OF THE DRAWINGS

The present invention is explained below with reference to preferred specific embodiments and the figures.

DETAILED DESCRIPTION OF EXAMPLE EMBODIMENTS

Figure 1:
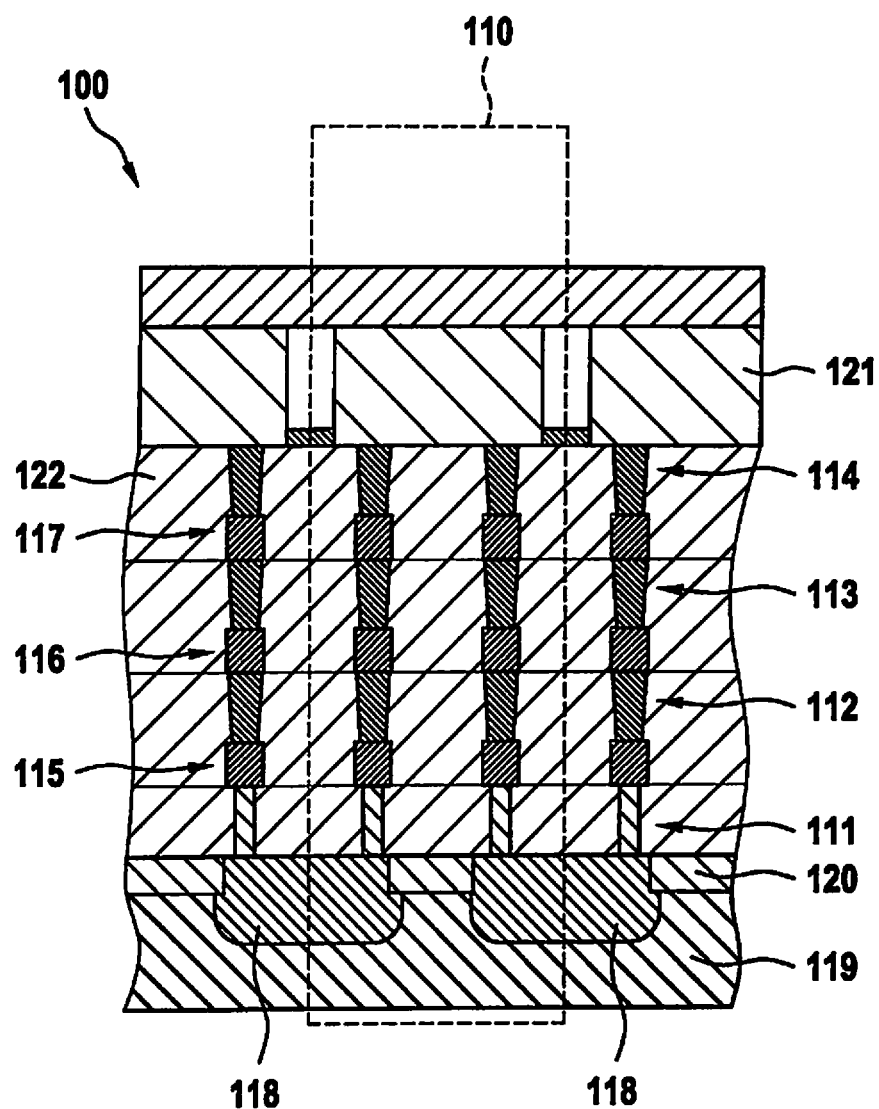
FIG. 1 shows a cross section of a basic element of a complete contact-via chain.

FIG. 1 shows cross section 100 of a basic element 110 of a complete contact-via chain. The basic element 110 or the structure comprises a combined interconnection of contacts 111, vias 112, 113 and 114, as well as metal segments 115, 116 and 117 and well resistors 118. In one development, the conductive path is run starting from a contact to the lowest metal or first metal segment 115, proceeding by way of a via 112 to the metal or second metal segment 116 lying thereabove and analogously up to the uppermost metal or terminating metal layer, e.g. top metal. From the uppermost metal or from the terminating metal layer, the basic element 110 of the contact-via chain is then guided back by way of vias 114, 113 and 112 and the metals 117, 116 and 115 lying therebetween to the contact level. The connection between two contacts occurs via a conductive diffused well, which is designed to be insulating vis-à-vis a substrate 119, for example an n-doped well in a p-doped substrate or vice versa. For this purpose, adjacent well or substrate portions must also be electrically insulated from one another, for example by the use of field oxide or isolation trenches 120.

FIG. 1 shows in exemplary fashion a semiconductor technology having four metal levels. It is also possible, however, to use semiconductor technologies having more or fewer metal levels.

For the individual metals, it is possible to use for example aluminum, gold, copper or also other metals as well as metal layer systems, for example copper-nickel-palladium, as well as alloys, for example AlCu. For the vias and contacts, it is possible to use tungsten, copper or also other metals and alloys. It is possible for the individual metal levels to be made up of different metals and to have varying layer thicknesses. Normally, the metals are developed in such a way that they form an overlap with respect to contacts 111 and vias 112, 113 and 114. This overlap may vary between metal layers 115, 116 and 117.

Other design variants result if the chain is built up only partially, for example only between first metal segment 115 and second metal segment 116 or only between a third metal segment 117 and the top metal 121.

The basic element 110 of the contact-via chain thus described may be extended to form a contact-via chain that has an electrical resistance by stringing together multiple basic elements. The resistance varies depending on the length and design. The contact-via chain is surrounded by dielectric material 122 or is embedded in dielectric material 122.

Figure 2:
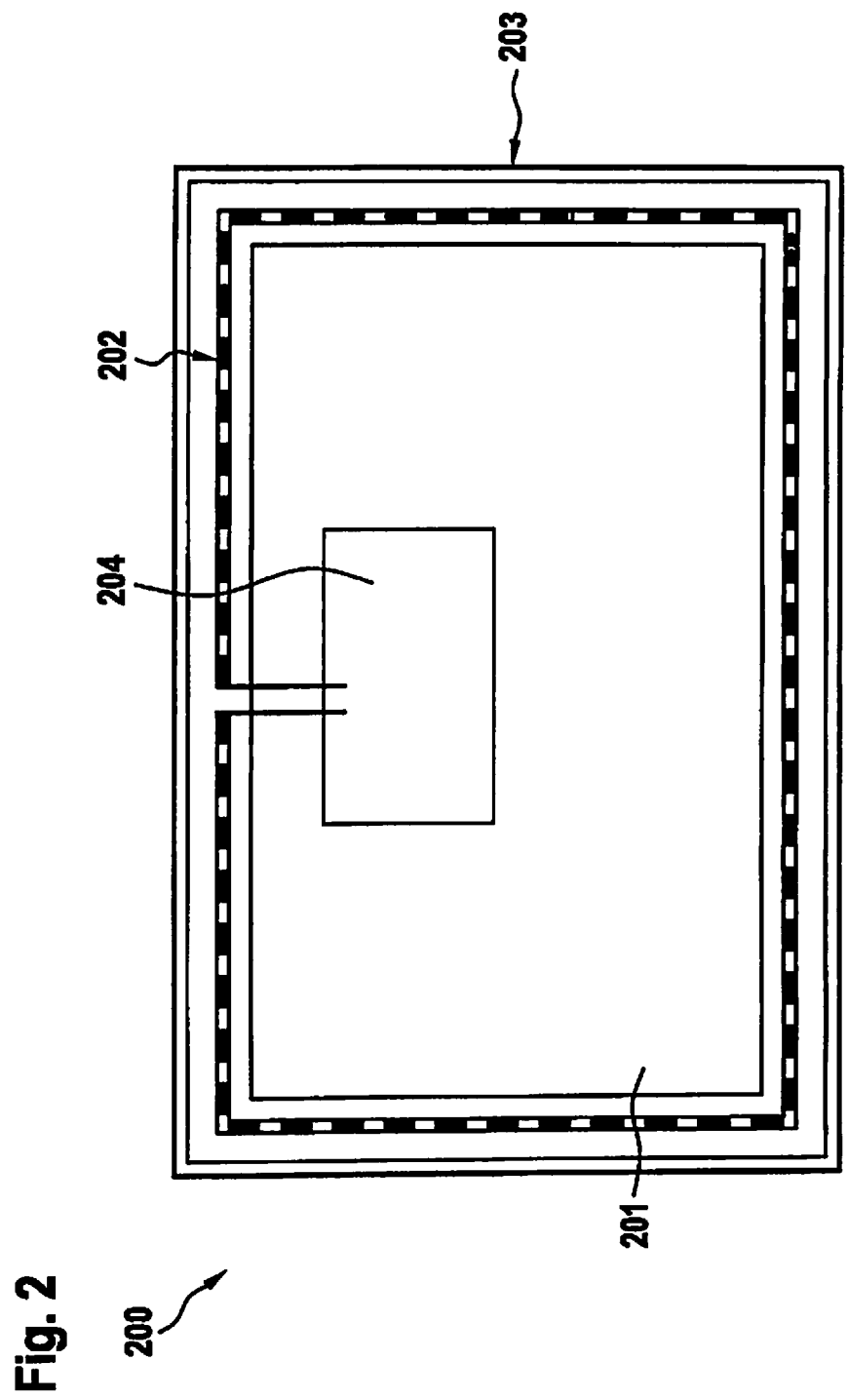
FIG. 2 shows a simplified circuit diagram of the contact-via chain within the guard ring.

FIG. 2 shows a simplified circuit diagram 200 of contact-via chain 202 within guard ring 203. In other words, contact-via chain 202 is used between the active area of the integrated circuit or semiconductor component 201 and guard ring 203. Contact-via chain 202 is run around active area 201. The ends of contact-via chain 202 are connected to an evaluation unit 204.

Through evaluation unit 204, contact-via chain 202 is connected to a positive electrical voltage vis-à-vis the substrate with the use of n-doped wells and a p-doped substrate or to a negative electrical voltage vis-à-vis the substrate with the use of p-doped wells in an n-doped substrate. For this purpose, it is possible to use for example the supply voltage Vdd.

Furthermore, evaluation unit 204 compares the electrical resistance of the chain to a reference value or threshold value. This reference value corresponds to the electrical resistance of the contact-via chain at the time of the initial wafer test and is stored in the component. In addition, it is also possible to use other evaluation mechanisms such as for example the relative comparison of two homogeneous contact-via chain segments in order to detect damage. The system is not limited to low-k materials.

Mechanisms are listed below that result in a change in the resistance and that are detectable with the aid of evaluation unit 204. A mechanical crack, which is caused by sawing and which breaks through the guard ring, severs the chain. This may occur initially during the sawing process or later by crack propagation during operation.

During the packaging process or also in operation, it is possible for cracks or delaminations to occur in the back end of the semiconductor material, in particular in the edge region of the semiconductor component, due to package stress, for example by molding compound. These result in mechanical breaks in the chain.

Due to process problems in the manufacture of the semiconductor wafer, damages or contaminations of interfaces in the back end of the semiconductor material may occur, which may result in delaminations in particular in the edge region of the semiconductor component and thus in mechanical breaking of the chain.

If one of the above-described cases of mechanical fault results only in the formation of a crack, but not in breaking the chain, the resulting gap from the edge of the semiconductor component to the contact-via chain may result in foreign substances diffusing inward. These may be all types of chemicals used in the packaging process, e.g. water, sawing additives, cleaning agents as well as contaminations from the packaging materials, for example die attach adhesive or molding compound. These foreign substances may cause corrosions or migrations in the metal layer system of the semiconductor component. Such damages are promoted by the presence of electrical charge or voltage. Since the contact-via chain is permanently at positive or negative potential vis-à-vis the substrate, corrosions of the metals used in the chain, for example aluminum, tungsten, copper, are effectively accelerated. The corrosion of the contact-via chain causes a change in resistance in the chain, which the evaluation unit is able to detect before the contaminations or damage advance further into the active area.

Figure 3:
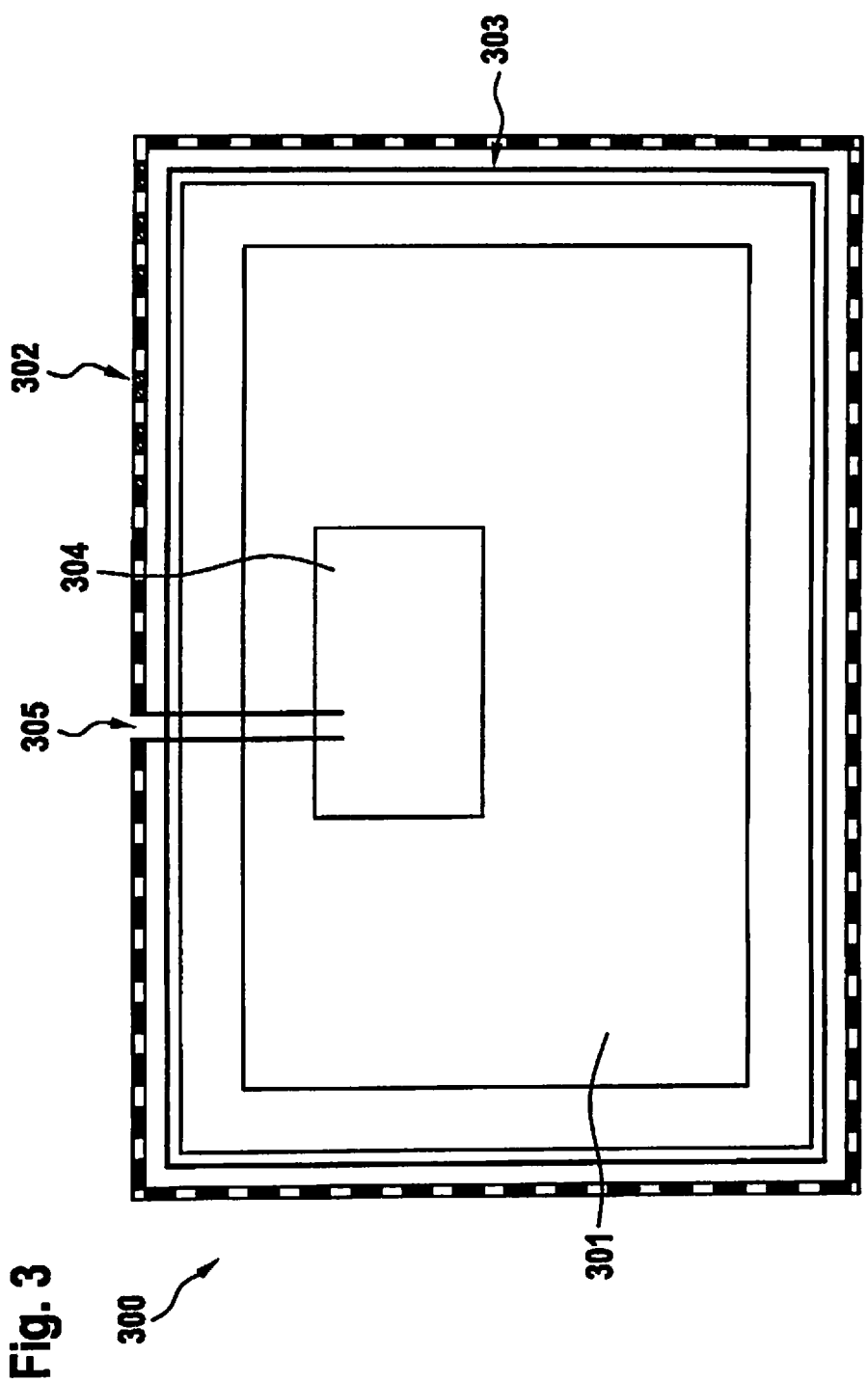
FIG. 3 shows a simplified circuit diagram of the contact-via chain outside the guard ring.

FIG. 3 shows a simplified circuit diagram 300 of contact-via chain 302 outside of guard ring 303, evaluation unit 304 being situated on semiconductor component 301. If damage is detected outside of guard ring 303, this is an indication of an increased risk of damage of guard ring 303. In some embodiments, the structure may only be used outside or on both sides of guard ring 303.

Figure 4:
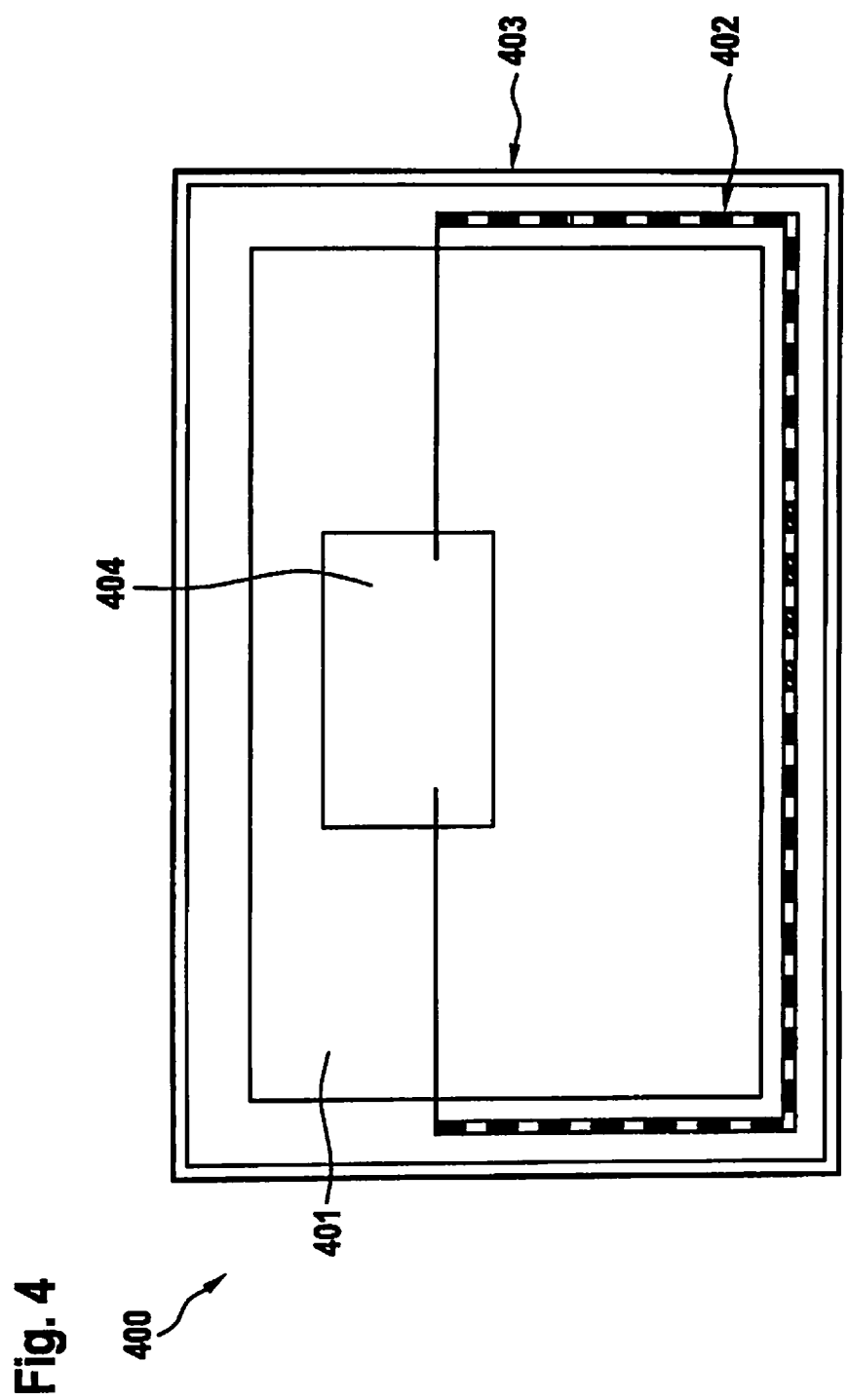
FIG. 4 shows a simplified circuit diagram of a contact-via chain that partially surrounds a semiconductor component.

FIG. 4 shows a simplified circuit diagram 400 of contact-via chain 402, which surrounds semiconductor component 401 partially, guard ring 403 and evaluation unit 404. In other words, contact-via chain 402 is used on one or more sides of the integrated circuit. This makes it possible to limit the detection to one or multiple directions.

Figure 5:
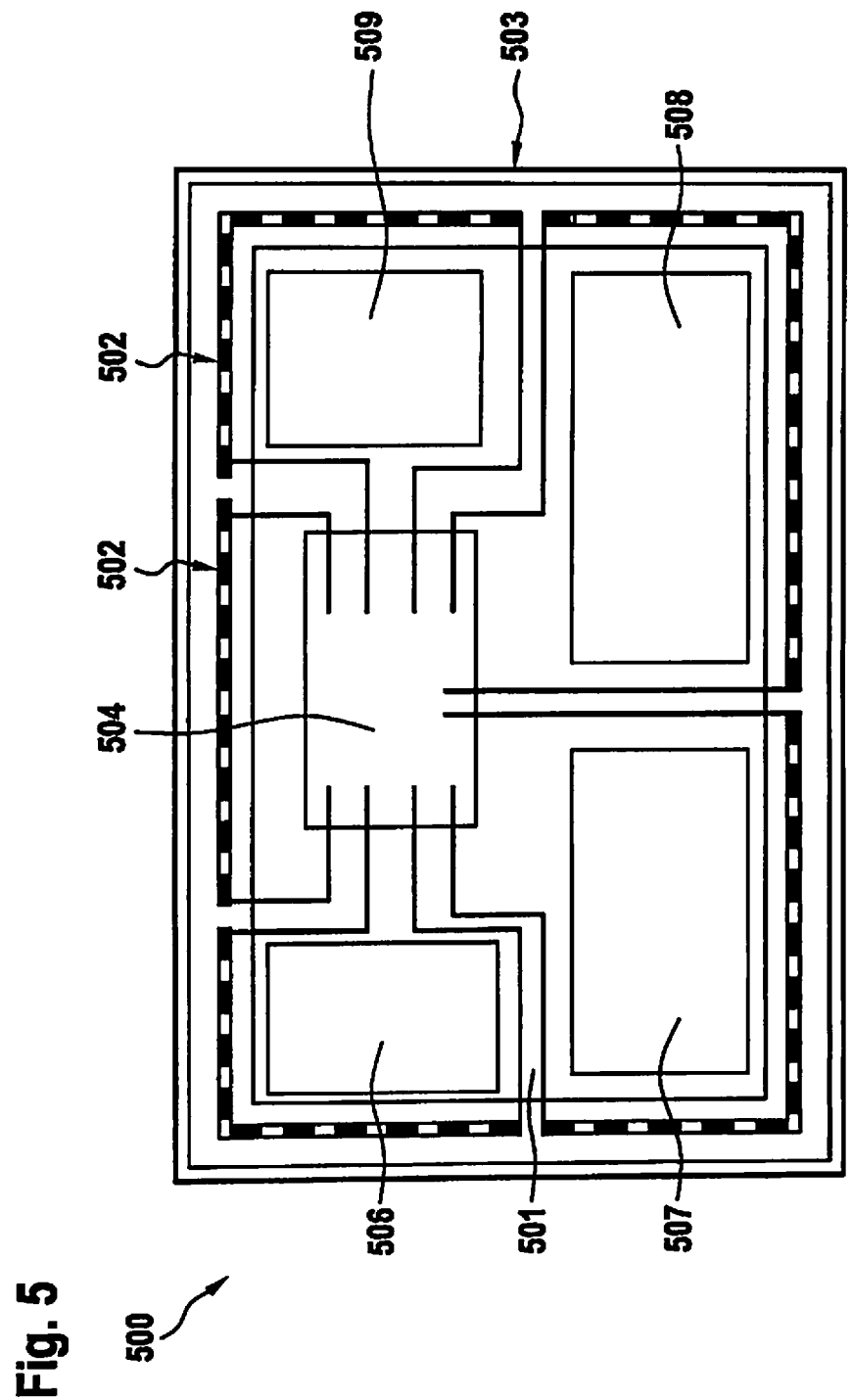
FIG. 5 shows a simplified circuit diagram of a contact-via chain that is arranged in segments or in regions.

FIG. 5 shows a simplified circuit diagram 500 of a contact-via chain 502 that is arranged in segments or regions, guard ring 503, evaluation unit 504 and by way of example four circuit modules 506, 507, 508 and 509. This means that the structure may also be built in individual segments. This allows for a spatially resolved or directionally resolved detection. This makes it possible to react to detected damage in a differentiated manner depending on the adjoining circuit module.

Figure 6:
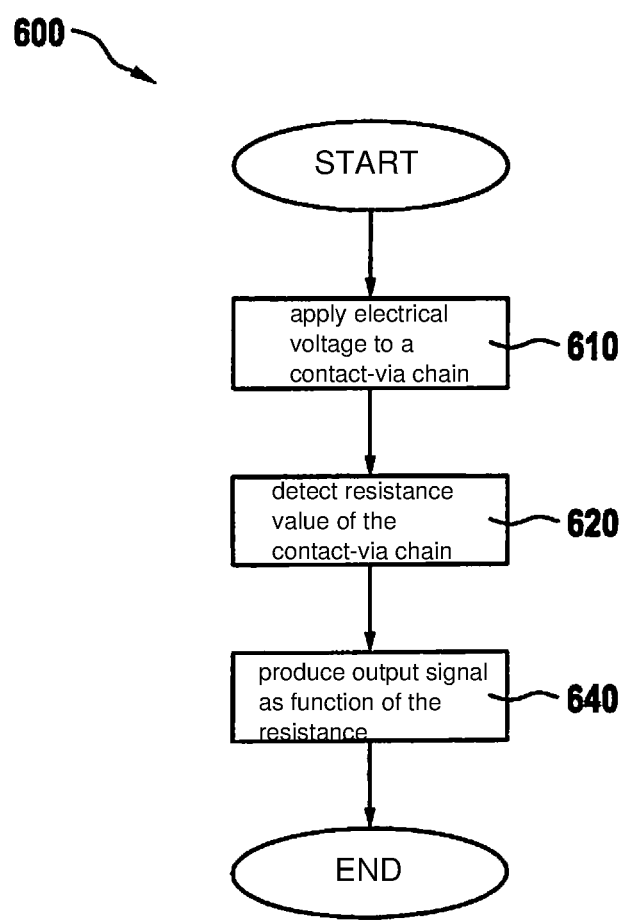
FIG. 6 shows a method for detecting faulty semiconductor components.

FIG. 6 shows method 600 for detecting faulty semiconductor components. Method 600 starts with step 610, in which an electrical voltage is applied to a contact-via chain. A resistance value of the contact-via chain is detected in a subsequent step 620. In a subsequent step 640, an output signal is produced as a function of the resistance value, that is, when the resistance value exceeds a threshold value or reference value. Optionally, the resistance value of the contact-via chain may be stored or filed in the semiconductor component or in a memory or the evaluation unit in a step 630 that is performed between step 620 and step 640.

Method 600 may be carried out at different points in time. Initially during the wafer test, also in order to check the function of the structure and to store an initial value as reference. After the packaging process in the final test step, in order to check the influence of the packaging process. In the field during each start procedure and for safety-critical applications also in situ permanently in the field.

What is claimed is:

1. A detector for determining a faulty semiconductor component, comprising:
    a semiconductor component;
    a contact-via chain situated laterally at a distance from the semiconductor component and which surrounds the semiconductor component in regions;
    a guard ring situated laterally at another distance from the semiconductor component; and
    an evaluation unit situated on the semiconductor component, wherein the evaluation unit is configured to apply a permanent electrical voltage to the contact-via chain to detect a resistance value of the contact-via chain and to produce an output signal when the resistance value of the contact-via chain exceeds a threshold value;

wherein the contact-via chain is connected, through the evaluation unit, to a positive electrical voltage by a substrate with n-doped wells and a p-doped substrate or to a negative electrical voltage by the substrate with the use of p-doped wells in an n-doped substrate, and wherein the contact-via chain is surrounded by dielectric material or is embedded in the dielectric material.

2. The detector as recited in claim 1, wherein the guard ring is situated outside of the contact-via chain.

3. The detector as recited in claim 1, wherein the guard ring is situated between the semiconductor component and the contact-via chain.

4. A method for detecting a faulty semiconductor component, the method comprising:

applying an electrical voltage to a contact-via chain, which is situated laterally at a distance from the semiconductor component and which surrounds the semiconductor component in regions, wherein a guard ring is situated laterally at another distance from the semiconductor component;

detecting a resistance value of the contact-via chain by applying a permanent electrical voltage to the contact-via chain; and producing an output signal when the resistance value of the contact-via chain exceeds a threshold value;

wherein the contact-via chain is connected to a positive electrical voltage by a substrate with n-doped wells and a p-doped substrate or to a negative electrical voltage by the substrate with the use of p-doped wells in an n-doped substrate, and wherein the contact-via chain is surrounded by dielectric material or is embedded in the dielectric material.

* * * * *